United States Patent [19]

Kasuga et al.

[11] 4,355,304

[45] Oct. 19, 1982

[54] DIGITAL COMPANDOR

[76] Inventors: Masao Kasuga, No. 1-6-17, Komachi-Dori, Sagamihara-City, Kanagawa-Ken; Norio Hiyama, No. 202, 7298-1, Ikuta, Tama-Ku, Kawasaki-City, Kanagawa-Ken; Yoshiyuki Tsuchikane, No. 3-27-10, Kamiikedai, Ohta-Ku, Tokyo, all of Japan

[21] Appl. No.: 217,949

[22] Filed: Dec. 18, 1980

[30] Foreign Application Priority Data

| Dec. 17, 1979 [JP] | Japan | 54-163858 |
| Dec. 27, 1979 [JP] | Japan | 54-173084 |
| Jan. 9, 1980 [JP] | Japan | 55-1149 |
| Jan. 9, 1980 [JP] | Japan | 55-1150 |
| Apr. 15, 1980 [JP] | Japan | 55-50081 |
| May 30, 1980 [JP] | Japan | 55-72522 |

[51] Int. Cl.³ .................................... H03K 13/24
[52] U.S. Cl. ........................ 340/347 DD; 364/582; 364/606; 340/347 AD
[58] Field of Search ............... 340/347 DD, 347 AD, 340/347 CC; 364/571, 582, 606; 324/115, 116

[56] References Cited

U.S. PATENT DOCUMENTS

| 3,906,487 | 9/1975 | Siems | 340/347 DD |
| 4,023,019 | 5/1977 | Leibowitz | 364/571 |
| 4,276,604 | 6/1981 | Kitamura | 364/571 |

FOREIGN PATENT DOCUMENTS 3044582  8/1981  Fed. Rep. of Germany .

OTHER PUBLICATIONS

"NTG-Fachtagung Signalverarbeitung" Erlangen 1973 Tagungsband, pp. 354–361.
Noll, "Zürich Seminar Proceedings" 1974, pp. B3(1)–B3(6).
Markel, "Linear Prediction of Speech" Springer–Verlag 1976, pp. 5–12.

*Primary Examiner*—C. D. Miller
*Attorney, Agent, or Firm*—Posnack, Roberts, Cohen & Spiecens

[57] ABSTRACT

A compressing system for digital modulated signals comprises an analog-to-digital converter for obtaining a digital modulated signal by digitally modulating an analog signal; a first variable gain circuit provided at the output side of the analog-to-digital converter; and a first gain control circuit for equivalently performing level-compression of the analog conversion level of the input digital modulated signal of the first gain control circuit within a predetermined level range by use of a first control signal and the first variable gain circuit. The first gain control circuit comprises an expected signal generating circuit having an analog conversion level $z_n$ which satisfies the equation $$z_n = \sum_{i=0}^{N} a_i \cdot |y_{n-i}|$$

(N is an arbitrary natural number, and $a_0$ through $a_N$ are zero or an arbitrary number) where $y_n$ designates the analog conversion level of a digital modulated signal or the differential signal of the digital modulated signal at a time nT obtained from either the input side or output side of said first variable gain circuit (T indicates the sampling period of the digital modulated signal) and $a_i$ designates the coefficient used for the weighting, a variable reference level generator which generates a reference level, and a comparator which supplies the first control signal as output by comparing the reference level thus generated with the analog conversion level $z_n$ of the above expected signal. The expanding system comprises a second variable gain circuit supplied with the digital modulated signal obtained and transmitted from the first gain control circuit, which varies the analog conversion level of the input digital modulated signal according to a second control signal; a second gain control circuit for equivalently performing level-expansion of the analog conversion level of the input digital modulated signal of the second gain control circuit by the same quantity as the above level-compression within a predetermined level range by use of the second variable gain circuit and performing an opposite operation as that performed by the first gain control circuit with respect to the digital modulated signal obtained from either the input side or the output side of the second variable gain circuit, and a digital-to-analog converter for converting the output digital modulated signal of the second variable gain circuit into an analog signal.

7 Claims, 19 Drawing Figures

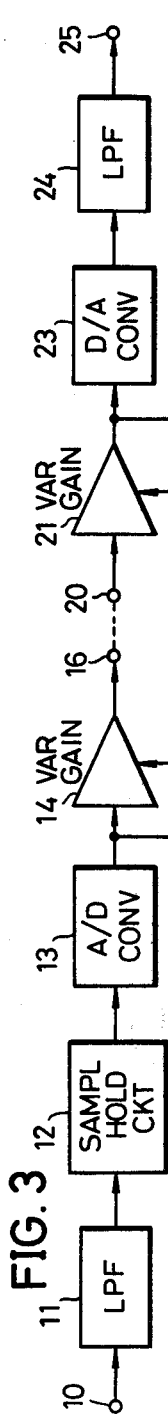
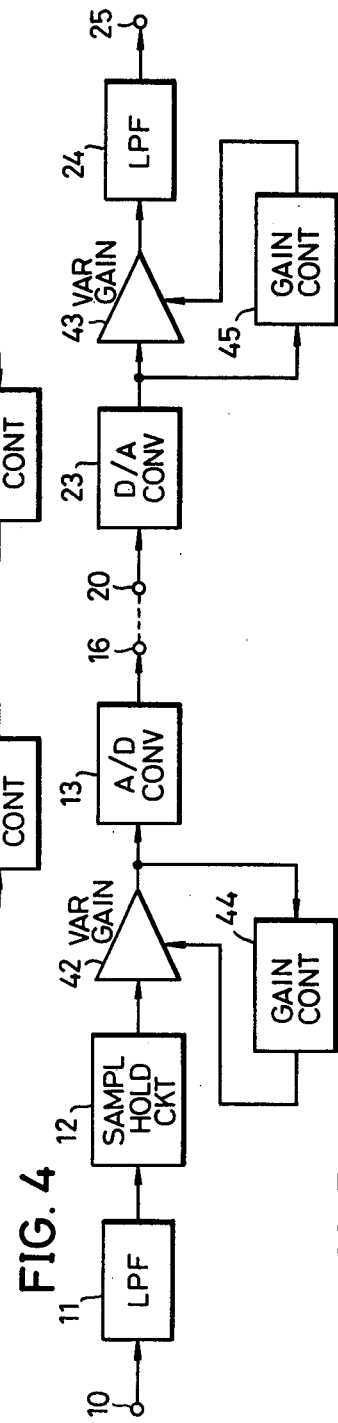
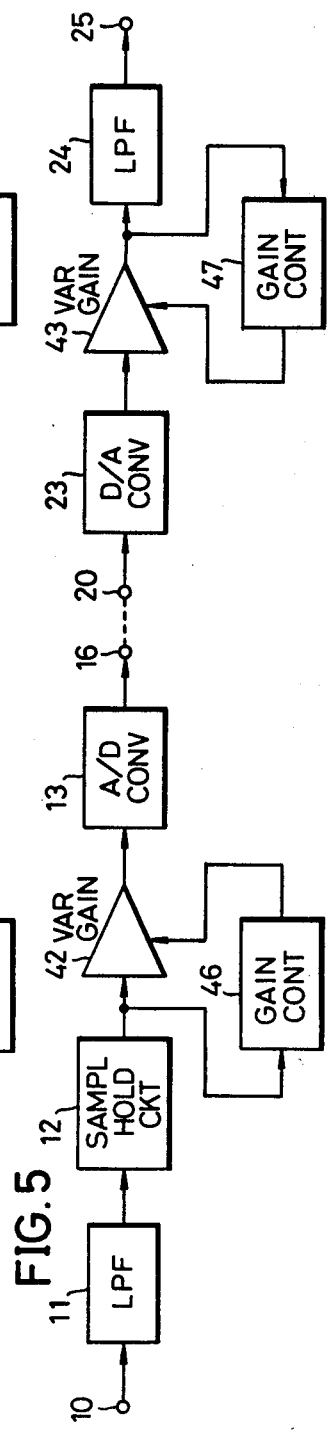

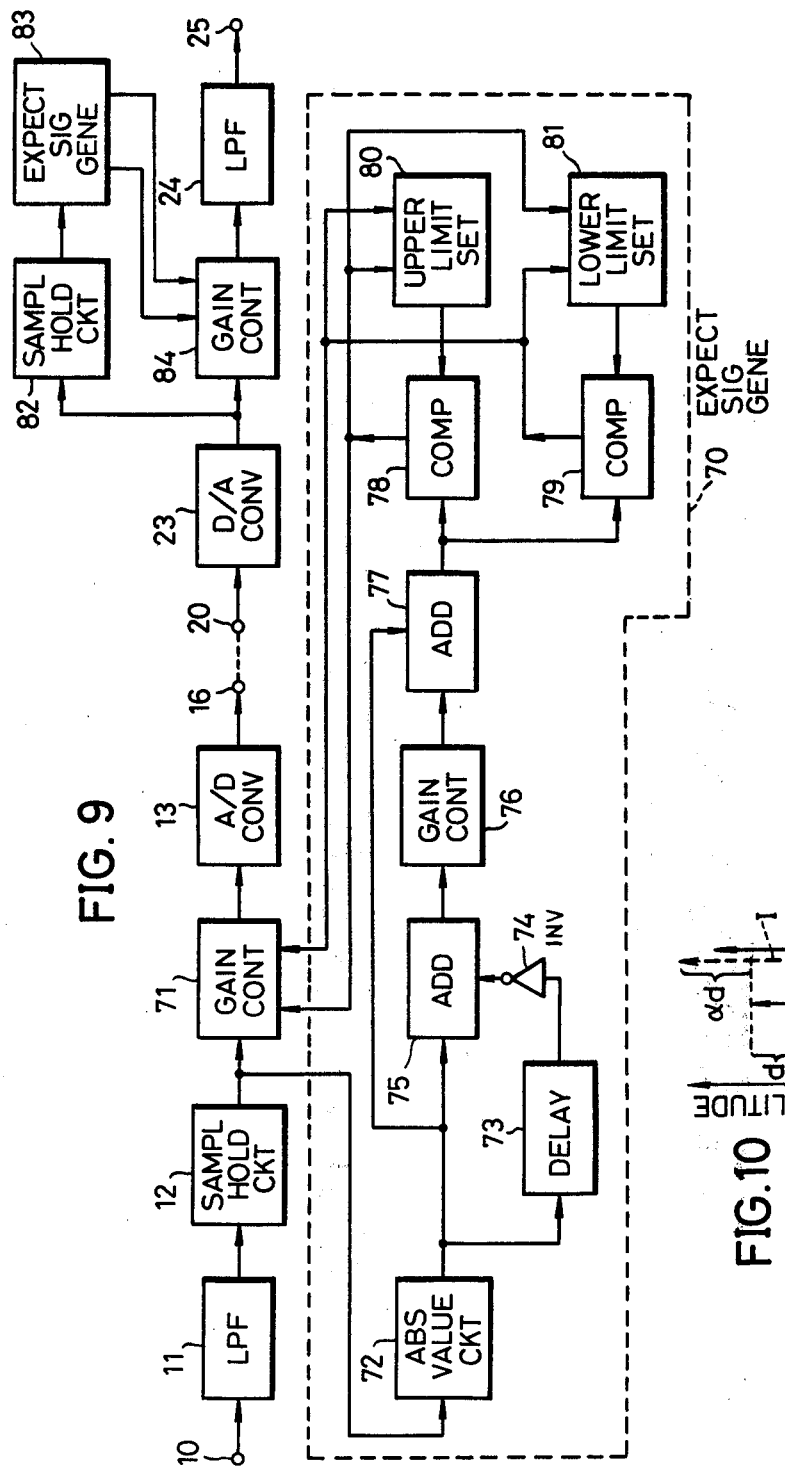

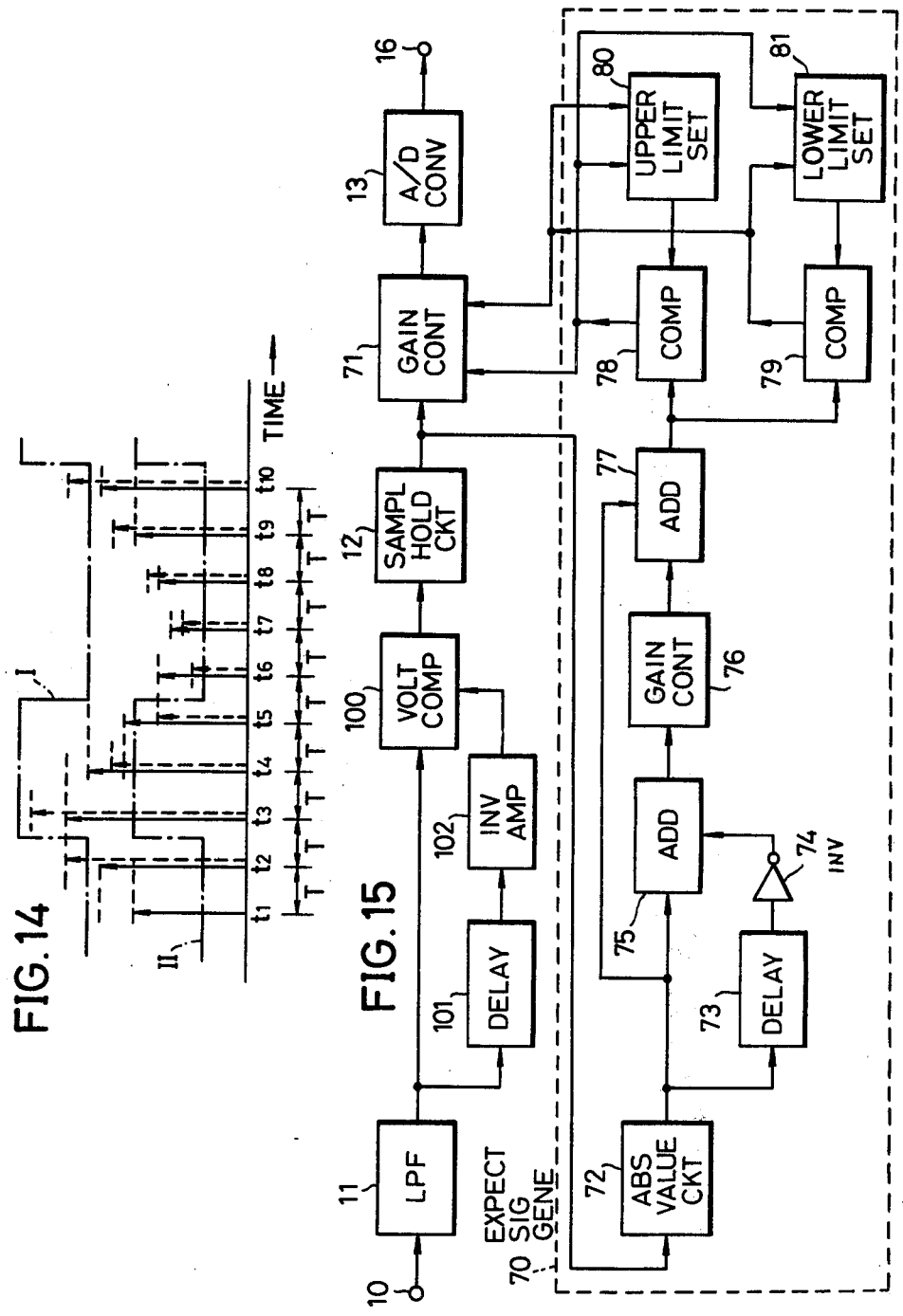

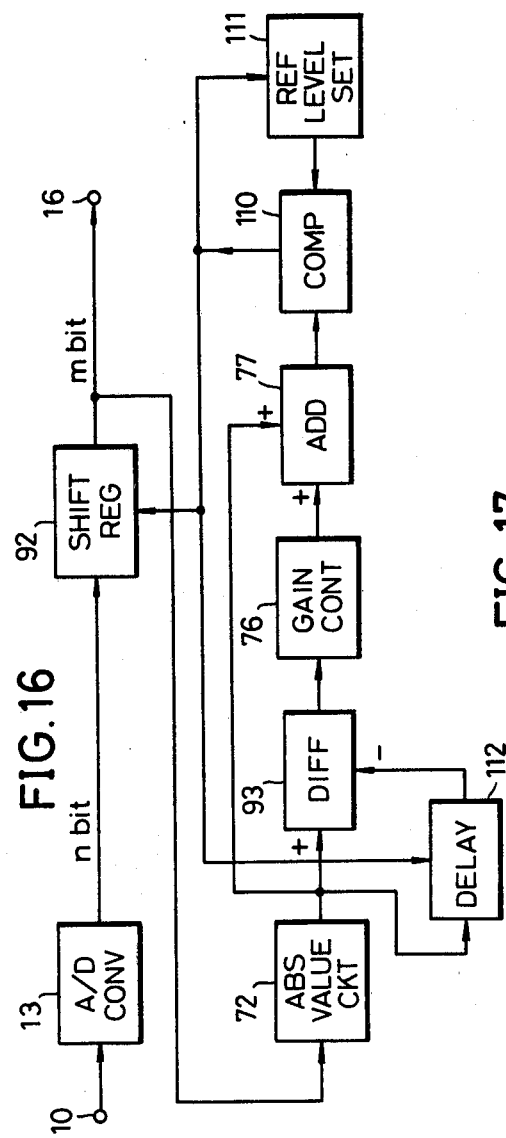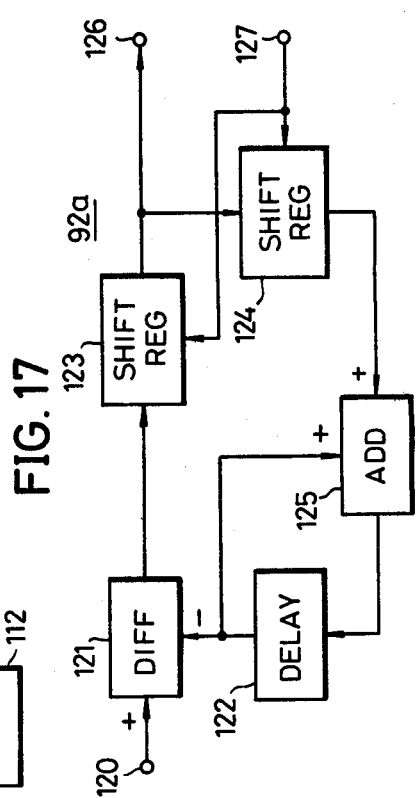

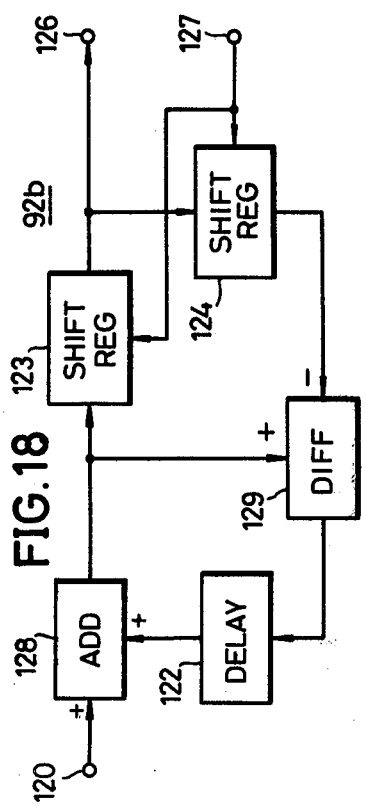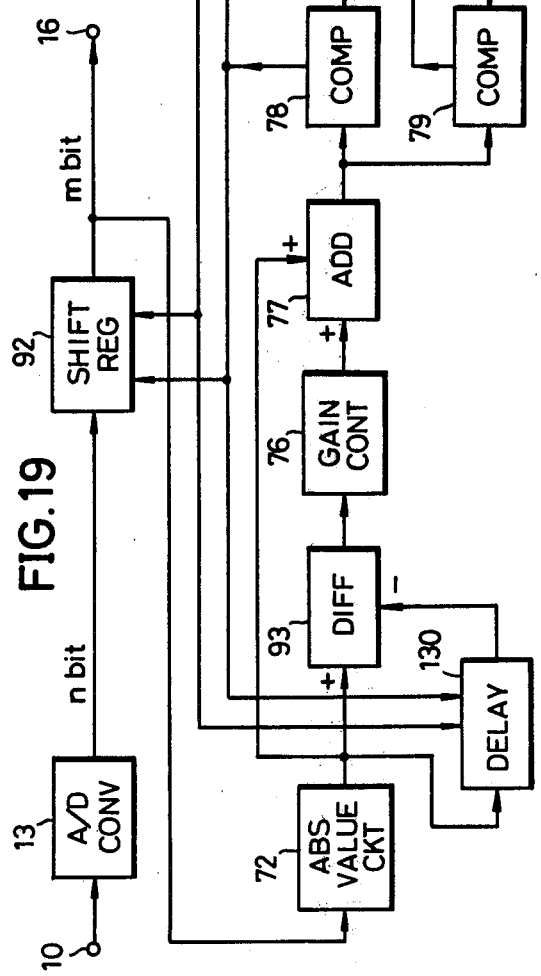

DIGITAL COMPANDOR

BACKGROUND OF THE INVENTION

The present invention relates generally to digital modulated signal compressing and expanding systems, and more particularly to a system in which the transmission of a control signal which indicates the information concerning the compression level of the signal upon expanding the level of the digital modulated signal at the receiving end, which is transmitted from the transmitting end after being compressed of its level, is not required, and, furthermore capable of transmitting the above signal by use of few number of bits.

Conventionally, one example of a digital modulated signal compressing and expanding system were of the following construction. That is, an analog signal is supplied to a low-pass filter wherein the unessential high-frequency component of the signal is eliminated, and this filtered signal is supplied to a sampling and holding circuit wherein the signal is sampled and held. The discrete sampled signal obtained from the sampling and holding circuit, is applied to an A/D (Analog-To-Digital) converter through a variable gain circuit. On the other hand, this discrete sampled signal is also supplied to an absolute-value circuit, wherein the absolute value is detected. The output signal of this absolute-value circuit, is supplied to a voltage comparator wherein the output signal thus supplied to the voltage comparator, is compared with a reference voltage supplied from reference voltage setting circuit. When the above output signal which is compared with the reference voltage exceeds the reference voltage, the gain of the above variable gain circuit is varied.

When the absolute value of the input voltage of the variable gain circuit becomes large, and becomes a voltage which is the minimum or the maximum voltage which is possible to be transmitted by the A/D converter, the variable gain circuit is varied of its gain by a gain control signal supplied from the above voltage comparator. As a result, the absolute value of the above output voltage is attenuated. Accordingly, the output voltage of the variable gain circuit, is always within a predetermined voltage range which is determined by the number of bits in the A/D converter.

The output voltage of the above described variable gain circuit is supplied to the A/D converter, wherein the output voltage undergoes analog-to-digital conversion (to be concrete, the output voltage is quantized and encoded) and converted into a digital modulated signal such as a pulse code modulation (PCM) signal. This digital modulated signal is supplied to a D/A (Digital-to-Analog) converter through a predetermined transmission path. The digital modulated signal thus supplied to the D/A converter, undergoes digital-to-analog conversion therein, and by use of another variable gain circuit, the wave portion which were attenuated or amplified of its level, is returned to its original state by the level expansion performed in the transmission system.

Therefore, in the above described conventional digital modulated signal compressing and expanding system, a variable gain circuit control signal which controls the gain of the variable gain circuit at the receiving end by the same amount the variable gain circuit at the transmission end was gain-controlled, in an opposite direction the variable gain circuit at the transmission end was gain-controlled, must also be transmitted as a transmission signal. Accordingly, there was a limit in reducing the number of transmission bits.

Generally, in the transmission system or the recording system for digital modulated signals, the cost and the complexity in the construction of the apparatus, is greatly affected by the capacity of signals which are to be processed. Hence, it is highly desirable to reduce the signal capacity as much as possible, within the range which maintains the allowable transmission quality.

SUMMARY OF THE INVENTION

Accordingly, a general object of the present invention is to provide a novel and useful digital modulated signal compressing and expanding system in which the above described problems have been overcome.

Another and more specific object of the present invention is to provide a digital modulated signal compressing and expanding system which comprises a first variable gain circuit provided at the output side of an A/D converter which obtains a digital modulated signal by digitally modulating an analog signal, a first gain control part which compresses the level of the analog conversion value of the digital modulated signal or the differential signal of the digital modulated signal which are obtained from the output (or input) side of the first variable gain circuit, a second variable gain circuit which is provided at the output (or input) side of a D/A converter and varies the analog conversion level of the output digital modulated signal supplied from the first variable gain circuit according to a control signal, and a second gain control circuit which forms an expected signal from the digital modulated signal obtained from the input (or output) side of the second variable gain circuit and expands the level of the signal by the amount the signal was compressed according to this expected signal. According to the system of the present invention, a digital modulated signal having a higher quality than the conversion accuracy of an A/D or D/A converter can be transmitted, and furthermore, the transmission of a control signal which indicates the information concerning the compression of the level is not required, enabling the digital modulated signal to be transmitted by use of fewer number of bits as compared to the conventional system.

Still another object of the invention is to provide a digital modulated signal compressing and expanding system in which judgement is made to judge whether the expected signal level is within the range between the upper limit reference value and the lower limit reference value, and the bit-shift in a shift register which is supplied with an input digital modulated signal according to the above judgement and which supplies an output digital modulated signal which is compressed or expanded of its level, is controlled so that the compressing and expanding of the digital modulated signal can be performed without transmitting or receiving the compressing information bit, by use of a system having simple circuit construction.

Another object of the invention is to provide a digital modulated signal compressing and expanding system in which a differential pulse encoding modulated signal which is transmitted by use of a certain limited number of bits, is obtained by shifting the bits in the input differential signal according to the input differential signal level, to effectively reduce the slope overload noise and the granular noise which is characteristic of the differential encoding modulated signal.

BRIEF DESCRIPTION OF THE DRAWINGS

FIGS. 3, 4, and 5 are systematic block diagrams respectively showing a first, a second, and a third modifications of the first embodiment shown in FIG. 1;

FIG. 9 is a systematic block diagram showing a third embodiment of the digital modulated signal compressing and expanding system according to the present invention;

FIG. 10 is a graph showing the analog conversion level for explaining the operation of an essential part of the systematic block diagram of FIG. 9;

FIG. 14 is a graph for explaining the operation of a part of the systematic block diagram of FIG. 13;

FIG. 15 is a systematic block diagram showing a fifth embodiment of the system of the present invention;

FIG. 16 is a systematic block diagram showing a sixth embodiment of the system of the present invention;

FIGS. 17 and 18 are systematic block diagrams respectively showing concrete embodiments of a shift register of FIG. 16; and FIG. 19 is a systematic block diagram showing a seventh embodiment of the system of the present invention.

DETAILED DESCRIPTION

Figure 1:
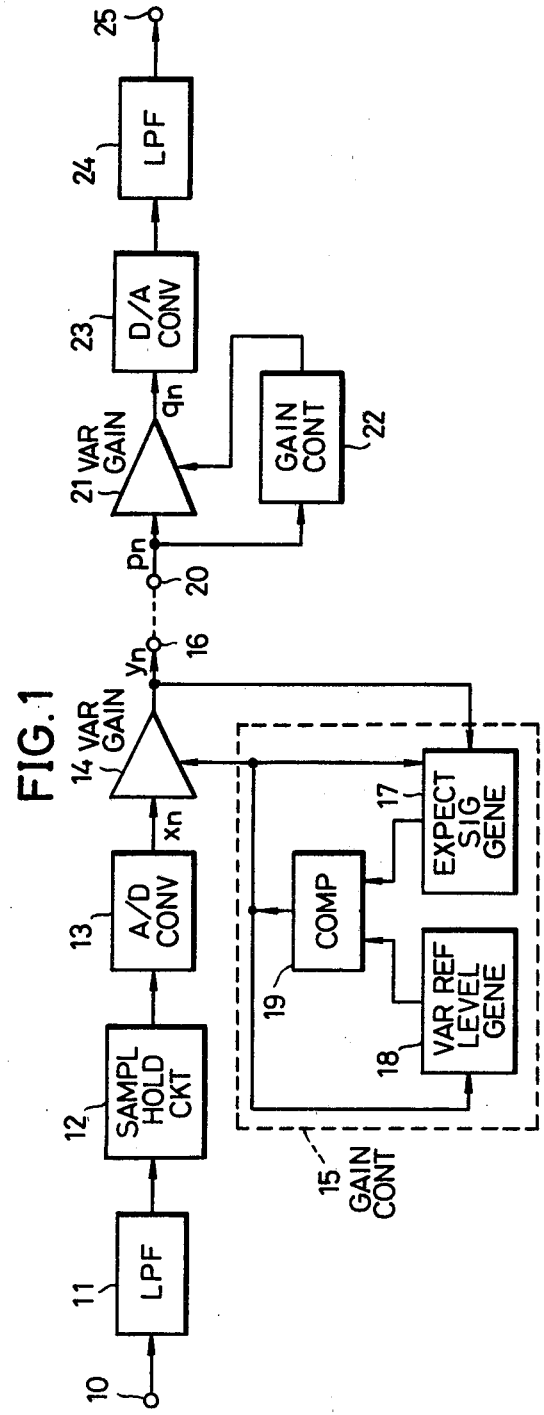
FIG. 1 is a systematic block diagram showing a first embodiment of a digital modulated signal compressing and expanding system according to the present invention.

In FIG. 1, an analog signal which is applied to an input terminal 10, is supplied to a low-pass filter 11 wherein the unessential high-frequency component of the analog signal is eliminated, and this filtered signal is supplied to a sampling and holding circuit 12 wherein the signal is sampled and held. The output signal of the sampling and holding circuit 12 is supplied to an A/D converter 13 wherein the above output signal undergoes analog-to-digital conversion (to be concrete, the output signal is quantized and encoded) and converted into a digital modulated signal such as a pulse code modulation (PCM) signal.

The digital modulated signal obtained from the A/D converter 13 is supplied to a variable gain circuit 14 which is constructed from a shift register, multiplier, or the like. The digital modulated signal thus supplied to the variable gain circuit 14 is varied of its analog conversion level by a control signal supplied from a gain control circuit 15. The output signal of the variable gain circuit 14 is transmitted through a terminal 16, as well as to an expected signal generating circuit 17 within the gain control circuit 15.

When the analog conversion level of the input digital modulated signal within the variable gain circuit 14 at a time nT is designated by $X_n$, and the gain of the variable gain circuit 14, and the analog conversion level of the output digital modulated signal of the variable gain circuit 14 at the time nT are respectively designated by $G_1$ and $y_n$, the following equation can be obtained.

$$y_n = x_n \cdot G_1 \qquad (1)$$

On the other hand, the expected signal generating circuit 17 is a circuit which generates the expected signal corresponding to the analog conversion level of the incoming digital modulated signal at a succeeding time $(n+1)T$, from the analog conversion level of each of the input digital modulated signal $y_n$ at the present time nT, and the digital modulated signal at a time which is at least one sampling time before the present time nT. When the analog conversion level of the output digital signal is designated by $z_n$, and the weighting coefficient which is added within the expected signal generating circuit 17 is designated by $a_i$ ($i=0 \sim N$), the expected signal generating circuit 17 supplies an output digital signal which can be described by the following equation (2).

$$z_n = \sum_{i=0}^{N} a_i \cdot |y_{n-i}| \qquad (2)$$

The above equation (2) also describes the output digital signal of a certain type of FIR (Finite Impulse Response) digital filter. Accordingly, the expected signal generating circuit 17 can be constructed of an FIR type digital filter. Moreover, the term $|y_{n-i}|$ in the above equation (2) describes a signal which is obtained by passing the digital modulated signal $y_{n-1}$ through an absolute-value circuit.

Figure 2:
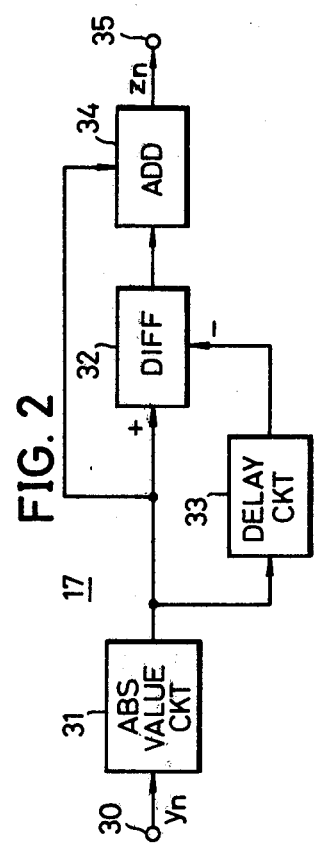
FIG. 2 is a concrete block diagram showing an embodiment of an expected signal generating circuit within the systematic block diagram of FIG. 1.

In a most simple example of the expected signal generating circuit 17 in which $a_0=2$, $a_1=-1$, and $a_2=a_3=\ldots=a_N=0$, the expected generating circuit of the construction shown in FIG. 2 can be obtained. In FIG. 2, the absolute value of the incoming digital modulated signal $y_n$, which is supplied to an input terminal 30, is detected in an absolute-value circuit 31. This detected absolute value, is directly supplied to a difference circuit 32, and also supplied to the difference circuit 32 through a delay circuit 33 which delays its input signal by a sampling period T. The difference circuit 32 obtains a differential signal by subtracting absolute value of a digital modulated signal $y_n$ of one sampling time before the absolute value of the digital modulated signal $y_n$ which is supplied by the absolute-value circuit 31, from the absolute value of the digital modulated signal $y_n$. The differential signal thus obtained, is added to the absolute value of the digital modulated signal $y_n$ at an adder 34. Hence, a digital signal $z_n$ having an expected incoming analog conversion level at a time $(n+1)T$, is supplied from an output terminal 35 as an expected output signal, until arrival of an incoming digital modulated signal $y_{n+1}$ at a succeeding time $(n+1)T$.

The output expected signal $Z_n$ of the expected signal generating circuit 17 is supplied to a comparator 19, wherein the level in the analog conversion value of the expected signal, is compared to a reference level $l_n$ which is supplied from a variable reference level generator 18. When the level of the digital signal $z_n$ is higher than the reference level $l_n$ as a result of the comparison, a signal which reduces the gain $G_1$ of the variable gain circuit 14 and also change the reference level of the variable reference level generator 18 into a new reference level which is reduced by the same amount as the gain $G_1$, is supplied as output from the comparator 19, and respectively supplied to the variable gain circuit 14 and the variable reference level generator 18. The reduction of gain at the variable gain circuit 14 is performed by shifting the bits in the LSB (Least Significant Bit) direction in the case where the variable gain circuit is constructed from a shift register, and by decreasing the value of the coefficient when the variable gain circuit is constructed from a multiplier. On the other hand, when the level of the digital signal $z_n$ is lower than the reference level $l_n$, a signal which increases the gain $G_1$ of the variable gain circuit 14 and also change the reference level of the variable reference level generator 18 into a new reference level which is increased by the same amount as the gain $G_1$, is supplied as output from the comparator 19, and respectively supplied to both the variable gain circuit 14 and variable reference level generator 18. The increase in the gain at the variable gain circuit 14 is performed by shifting the bits in the MSB (Most Significant Bit) direction in the case where the variable gain circuit is constructed from a shift register, and by increasing the value of the coefficient when the variable gain circuit is constructed from a multiplier. Furthermore, the output of the comparator 19 is also supplied to the expected signal generating circuit 17.

Therefore, the digital modulated signal $y_n$, which is obtained through the gain-control (level-control of the analog conversion level) of the gain $G_1$ at the variable gain circuit 14, by the output signal of the gain control circuit 15 supplied according to the expected signal, is increased of its minimum level of quantization when the variance in the analog conversion level is large. On the other hand, when the variance in the analog conversion level is small, the minimum level of quantization is reduced. Accordingly, the digital modulated signal becomes a signal which is equivalent to a signal which has undergone a more fine quantization.

The above described digital modulated signal is transmitted through a predetermined transmission path, and is supplied to a variable gain circuit 21 and a gain control circuit 22, through a terminal 20. The variable gain circuit 21 is of the same construction as the variable gain circuit 14, and the analog conversion level of the digital signal which is supplied to this variable gain circuit 21 is variably controlled by the output of the gain control circuit 22. When the analog conversion level of the input digital modulated signal within the variable gain circuit 21 at the time nT is designated by $p_n$, and the analog conversion level of the output digital modulated signal at the time nT and the gain of the variable gain circuit 21 are respectively designated by $q_n$ and $G_2$, the following equation is satisfied.

$$q_n = p_n \cdot G_2 \tag{3}$$

On the other hand, the gain control part 22 is of the same construction as the above described gain control circuit 15, however, the operation is the reverse of that of the gain control circuit 15. That is, when the analog conversion level of the expected signal obtained from the digital modulated signal $p_n$ is higher than the reference level at the comparator (not shown) of the gain control circuit 22, the gain control circuit 22 operates so as to increase the gain $G_2$ and also change the reference level to a larger value by the same amount the gain $G_2$ was increased. On the other hand, when the analog conversion level of the expected signal obtained from the digital modulated signal $p_n$ is lower than the reference level at the comparator of the gain control circuit 22, the gain control circuit 22 operates so as to reduce the gain $G_2$ and also change the reference level to a smaller value by the same amount the gain $G_2$ was reduced. Hence, the gain-control performed by the gain control circuit 22, is a complementary level expansion operation compared to the gain-control performed by the gain control circuit 15, and satisfies the following equation.

$$G_1 \cdot G_2 = 1 \tag{4}$$

Furthermore, $$y_n \approx p_n \tag{5}$$

The digital modulated signal (analog conversion level $q_n$) which is obtained from the variable gain circuit 21, is supplied to a D/A converter 23. And, from the above equations (1), (3), (4), and (5), the following equation (6) can be formed.

$$\begin{aligned} q_n &= p_n \cdot G_2 \\ &\approx y_n \cdot G_2 \\ &= x_n \cdot G_1 \cdot G_2 \\ &= x_n \end{aligned} \tag{6}$$

Or simply, $$q_n \approx x_n$$

Accordingly, the digital modulated signal which is compressed of its level at the transmission side, is expanded of its level at the receiving end, and converted back into the original digital modulated signal.

The above compressing and expanding of the signal level is performed according to the expected signal in the present embodiment. When $a_0 = 2$, and $a_1 = -1$, in the equation (2), for example, an expected signal obtained by differentiation can be obtained as seen from the following equation (7).

$$\begin{aligned} Z_n &= y_n + (y_n - y_{n-1}) \\ &= y_n + \frac{dy_n}{dt} \end{aligned} \tag{7}$$

Similarly, by using suitable weighting techniques in the equation (2), a suitable expected signal can be obtained responsive to the characteristic of the input digital modulated signal. As clearly seen from the equation (2), the above described expected signal, can be obtained from the digital modulated signal. Hence, unlike the conventional system in which a gain control signal must be separately transmitted to the receiving end, the digital modulated signal can be compressed, expanded, and transmitted by use of fewer number of bits compared to the conventional transmission system.

FIG. 3 shows a systematic block diagram of a first modification of the system of the above embodiment. In FIG. 3, those parts which are the same as those corresponding parts in FIG. 1 are designated by the like reference numerals, and their description will be omitted. In the present modification, a gain control circuit 40 receives the output digital modulated signal of the A/D converter 13 as its input signal, and forms a variable gain control signal for the variable gain circuit 14. On the other hand, a gain control circuit 41 receives the output digital modulated signal of the variable gain circuit 21 as its input signal, and forms a control signal which varies the gain of the variable gain circuit 21. The gain control circuits 40 and 41 are of similar construction as the gain control circuits 15 and 22, and therefore, the present modification also comprises the similar characteristics as those of the first embodiment.

FIGS. 4 and 5 respectively show systematic block diagrams of a second and a third modifications of the present invention. In FIGS. 4 and 5, those parts which are the same as those corresponding parts in FIG. 1 are designated by the like reference numerals, and their description will be omitted. In the second and the third modifications, variable gain circuits 42 and 43, are respectively supplied with the output sampled signal of the sampling and holding circuit 12 and the output of the D/A converter 23. Therefore, in these modifications, the term $y_n$ in equation (1), the terms $y_{n-i}$ and $z_n$ in equation (2) all indicate the signal level, and not the analog conversion level.

In the second modification of the invention, a gain control circuit 44 forms an expected signal from the output signal of the variable gain circuit 42, by the above described method. The level of the expected signal thus obtained, is compared with the reference level, and when the expected signal level is higher than the reference level as a result of the comparison, the gain control circuit 44 controls and reduces the gain of the variable gain circuit 42, and also reduces the level of the reference level. On the other hand, when the expected signal level is lower than the reference level, the gain control part 44 controls and increases the gain of the variable gain circuit 42, and increases the reference level. A gain control circuit 45 is of similar construction as the gain control circuits 22 and 41, and accordingly performs similar operation.

In the third modification of the invention shown in FIG. 5, a gain control circuit 46 is supplied with the output sampled signal of the sampling and holding circuit 12, and varies the gain of the variable gain circuit 42 by use of a control signal which is obtained by an operation similar to that performed by the gain control circuit 44. A gain control circuit 47 is supplied with the output analog signal of the variable gain circuit 43, and variable controls the gain of the variable gain circuit 43 by use of a control signal which is obtained by an operation similar to that performed by the gain control circuit 45. As described above, the second and third modifications of the invention comprise similar characteristics as those of the first modification.

The analog conversion level of the digital modulated signal is compressed and expanded of its level in the first embodiment and the first modification, and in the second and third modifications, the modulated signal (analog signal) level of the digital modulated signal is compressed and its demodulated signal level is expanded. However, the same object can be fulfilled by compressing and expanding the differential signal level of the differential signal ($m_n - m_{n-1}$), where $m_n$ indicates the analog conversion level of the digital modulated signal at the time nT.

Figure 6:
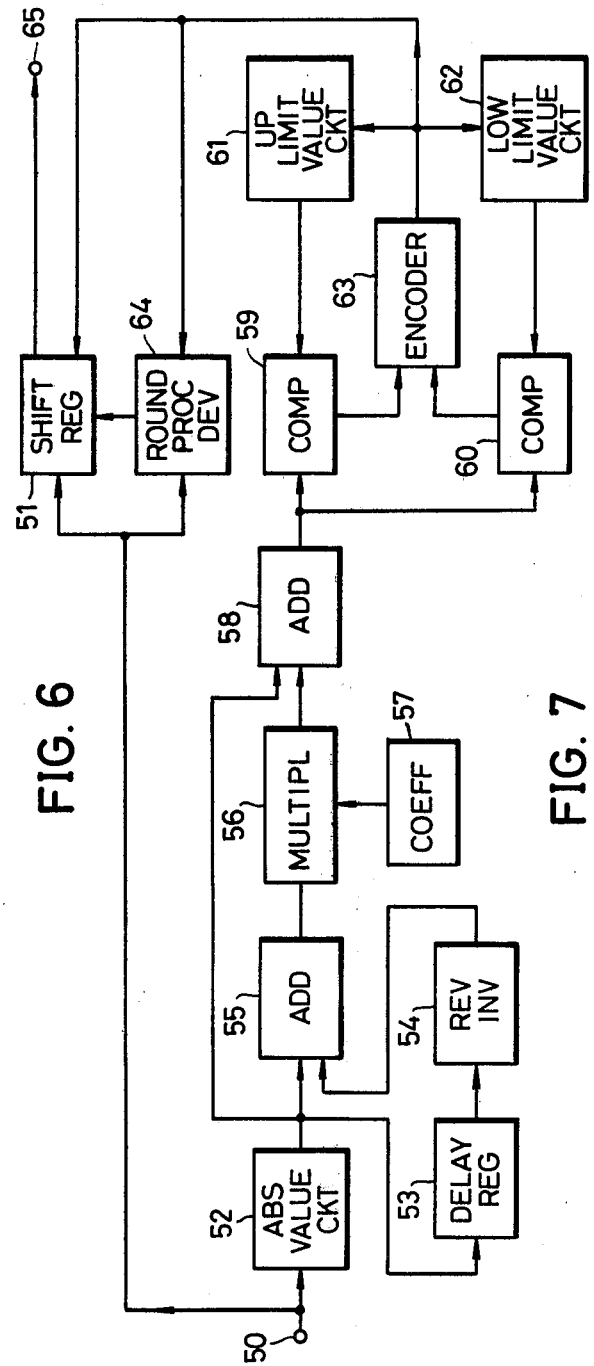
FIG. 6 is a systematic block diagram showing a second embodiment of the digital modulated signal compressing and expanding system according to the present invention.

A second embodiment of the present invention will now be described in conjunction with FIG. 6. The compressing system and the expanding system in FIG. 6, are of the same construction as those in the systematic block diagram of FIG. 2. The operation of the compressing system will first be described. An incoming digital modulated signal having n bits per sample which is supplied to an input terminal 50, is supplied to a shift register 51 wherein the digital modulated signal is stored momentarily. The above digital modulated signal is also supplied to an absolute-value circuit 52, wherein the absolute value is detected. The output digital signal of the absolute-value circuit 52 is delayed at least by one sampling interval at a delay register 53. The signal thus delayed, is inverted of the signal polarity at an inverter 54, and then supplied to an adder 55 wherein the signal supplied to the adder 55 is added with the digital signal at the present time which is supplied from the absolute-value circuit 52. Accordingly, the output digital signal of the adder 55 is a differential signal, which shows the level of a signal which is obtained by subtracting an output digital signal of the absolute-value circuit 52 of at least one sample interval before the present time, from an output signal of the absolute-value circuit 52 at the present time. The above differential signal is supplied to a multiplier 56, wherein this differential signal is multiplied with a coefficient (digital signal) used for weighting which is supplied from a coefficient circuit 57.

The output signal of the multiplier 56 is supplied to an adder 58, wherein the output signal of the multiplier 56 is added with the output digital signal of the absolute-value circuit 52. Hence, an expected signal which indicates the expected value of output digital signal of the absolute-value circuit 52 of one sampling interval after the digital signal of the absolute-value circuit 52 at the present time, can be obtained. Therefore, when the value of the coefficient in the coefficient circuit 57 is set at "1", for example, the multiplier 56 and the coefficient circuit 57 can both be omitted, and the circuit construction is greatly simplified.

The analog conversion level of the above expected signal is compared with the level of an upper limit reference value H(i) of the present time, at a comparator 59, where the upper limit reference value H(i) is one of the upper limit reference values H which are the plurality of predetermined levels set at an upper limit reference value setting circuit 61. On the other hand, the analog conversion level of the above expected signal is also compared with the level of a lower limit reference value L(i) of the present time, at a comparator 60, where the lower limit reference value L(i) is one of the lower limit reference values L which are the plurality of predetermined levels set at a lower limit reference value setting circuit 62. Therefore, when the analog conversion level of the expected signal at the present time is within a predetermined level range between the upper limit reference value H(i) and the lower limit reference value L(i) as a result of the above described comparisons, the upper limit reference value H(i) and the lower limit reference value L(i) are not renewed and maintained at the same value, by an output signal from an encoder 63 which is supplied with the output signals of the comparators 59 and 60. Furthermore, in the above case, the shifting in the shift register 51 is not performed. Hence, the predetermined upper m bits of the input n-bit digital modulated signal of the shift register 51, is supplied to an output terminal 65, after the transmission of the LSB side of the digital wave, or the processing of the information which are not reproduced, is performed by a rounding processing circuit 64. Generally, cutoff, rounding, or absolute-value cutoff methods are used for the above process, however, in a case where arithmatic processing is not performed after the demodulation, for example, it is only necessary to perform a processing operation in which the distortion upon demodulation is small.

Figure 8:
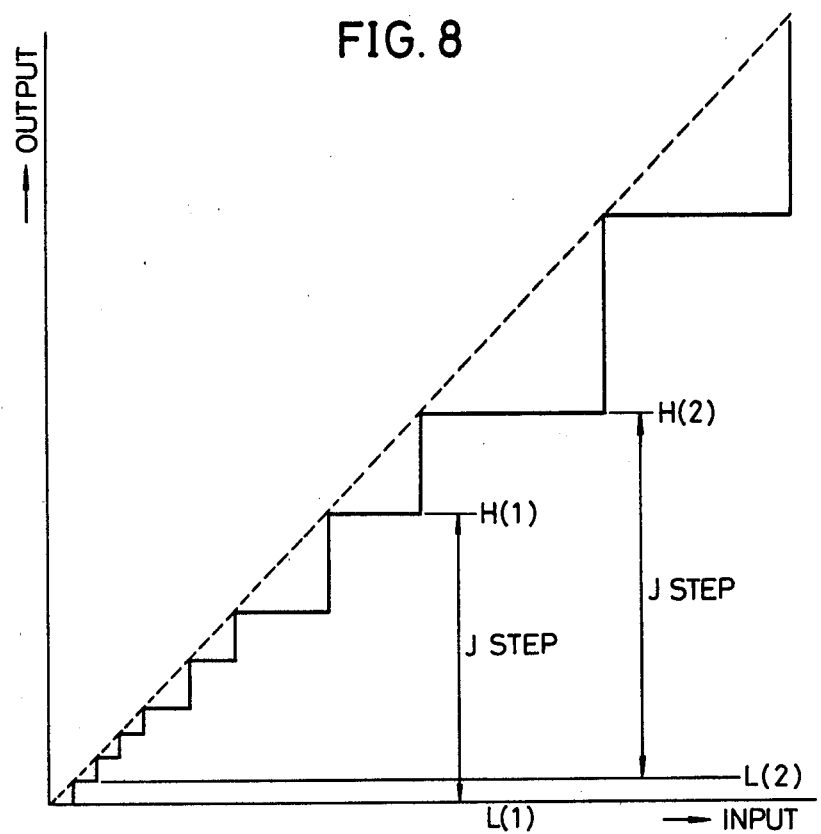
FIG. 8 is a graph showing an example of the input/output characteristic of the compressing system of FIG. 6.

However, when the analog conversion level of the above expected signal is not within the range between the upper limit reference value H(i) and the lower limit reference value L(i), a quantization level J within the level range shown in FIG. 8 which is established by the output signal of the encoder 63, is maintained at a constant level. Moreover, the upper limit reference value and the lower limit reference value are successively shifted in the direction of the expected signal analog conversion level (the whole predetermined level range is successively shifted), so that the expected signal analog conversion level is within the predetermined level range. Furthermore, when the upper limit reference value and the lower limit reference value are increased, the information in the shift register 51 is shifted towards the left-hand-side direction, by the output signal of the encoder 63. On the other hand, when the upper limit reference value and the lower limit reference value are reduced, the information in the shift register 51 is shifted towards the right-hand-side direction.

The shift register 51 constantly compresses an n-bit input digital modulated signal into a predetermined m-bit digital modulated signal, and transmits the signal thus obtained through the output terminal 65. Hence, by the above described shift to the left-hand-side, m bits which exist at the bit positions higher than that of before is transmitted. On the other hand, by the shift towards the right-hand-side, m bits which exist at the bit positions higher than that of before is transmitted. Accordingly, compression of information having (n-m) bits per sample, is thus performed. In the present embodiment of the invention, similar expecting operation as that described above, is also performed in the expanding system, as will be described in the following. Therefore, a signal information having m bits per sample need only be transmitted, unlike the conventional system in which information bits for triggering the expanding operation by the same amount the compression was performed, must be transmitted together with the signal information.

Figure 7:
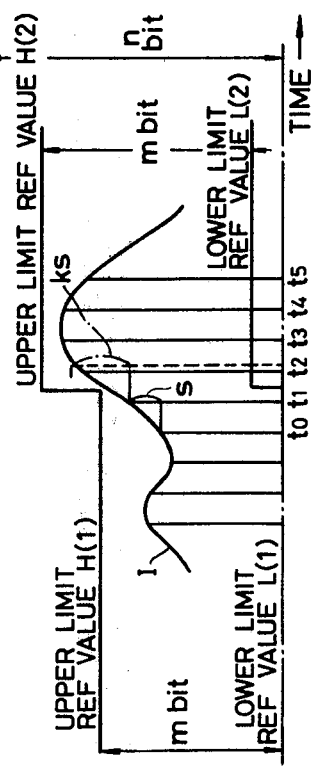
FIG. 7 is a graph showing the signal level variation for explaining the operation of the essential parts of the systematic block diagram of FIG. 6.

The above described processing, will now be described in relation to the waveform shown in FIG. 7. In FIG. 7, the original analog signal is designated by a curve I. Furthermore, the time intervals between times t0 and t1, t1 and t2, —, are all equal to one sampling interval. In the example shown in FIG. 7, the difference component s between the respective absolute value outputs shown by the solid lines at the times t1 and t0, is multiplied by a suitable coefficient k. When the analog conversion level of the expected signal at time t2, obtained by adding the above multiplied signal with the absolute value output at time t1, which is shown by the dotted lines, is outside above the predetermined level range between the upper limit reference value H(1) and lower limit reference value L(1), this state is detected at time t1. Accordingly, the upper limit reference value and the lower limit reference value are respectively shifted from H(1) and L(1) to H(2) and L(2) by the time t2, and the actual data shown by the solid line is transmitted at the time t2, as seen in FIG. 7. Furthermore, the number of data bits are the same in both cases.

As clearly understood from the graph of FIG. 7, the above described operation is an operation in which a type of non-linear quantization is performed. Accordingly, the input/output characteristic of the above, can be shown, for example, by the solid line of FIG. 8.

The operation of the expanding system will now be described. The circuit construction of the expanding system is similar to that of the expanding system of FIG. 6. Hence, an incoming m-bit digital modulated wave which is transmitted or reproduced, is supplied to the input terminal 50. This incoming wave is expanded back into the original n-bit digital modulated wave by the same amount the wave was compressed, and obtained through the output terminal 65. The wave thus obtained, is then supplied to the D/A converter in the next stage. In the expanding system, judgement is made on whether the expected signal analog conversion level is outside of the predetermined level range by obtaining the expected signal. Therefore, when the expected signal analog conversion level is outside of the predetermined level range, the upper limit reference value and the lower limit reference value are shifted until the expected signal analog conversion level is within the established level range, as in the compressing system. However, in the expanding system, the shifting direction in the shift register 51 is performed in the opposite direction as that for the compressing system. Thus, since the shift control operation is performed by judging whether the expected signal analog conversion level is within the established level range, the compressing information bit such as that used in the conventional system, is not required.

In the expanding system, the bit-shift is performed in the opposite direction as that performed in the compressing system. Moreover, the shift with respect to the parts which are transmitted or not reproduced at the LSB side, is considered to be zero and the output of the rounding processing circuit 64 is maintained at low level. Hence, an n-bit digital modulated signal can be obtained from the shift register 51 through the output terminal 65. The input/output characteristic of the above expanding system is a complementary characteristic as compared to that upon compression which is shown by the solid line of FIG. 8. Thus, in the expansion system, a digital modulated signal having a characteristic shown by dotted lines of FIG. 8, is obtained from the output terminal of the expansion system, as compared to the input digital modulated signal of the compressing system.

A third embodiment of the present invention will now be described in conjunction with FIG. 9. In FIG. 9, those parts which are the same as those corresponding parts in FIG. 1 are designated by the like reference numerals, and their description will be omitted. The sampled signal which is obtained from the sampling and holding circuit 12 is supplied to an expected signal generating circuit 70 which is shown by the dotted lines, and also supplied to a gain control circuit 71. The output signal of the sampling and holding circuit 12 which is supplied to the expected signal generating circuit 70, is first supplied to an absolute value circuit 72 wherein the absolute value of the signal thus applied is obtained, and then respectively supplied to a delay circuit 73 and an adder 75. The delay circuit 73 delays the input signal by a time equal to one sampling period of the sampling and holding circuit 12, and then supplies the delayed output signal to the adder 75 through an inverter 74. The output signal of the adder 75 is supplied to an adder 77 after being controlled of gain to perform the suitable weighting. The signal thus supplied to the adder 77 is added with the output signal of the absolute-value circuit 72, within the adder 77. Accordingly, the adder 77 adds the output signal of the absolute-value circuit 72 with an output signal (minor coefficient detecting signal) of a gain control circuit 76 of one sampling period before the above output signal, and generates an output expected signal.

Hence, when the analog conversion level of the output sampled signal supplied from the absolute-value circuit 72 is of the form shown by the solid line arrow of FIG. 10, for example, a sampled signal (differential signal), which shows a differential component d between the analog conversion level at time t1 and the analog conversion level at a time t2 which is one sampling period after the above time t1, is supplied as output from the adder 75 at the time t2. Furthermore, the above output thus supplied from the adder 75 is multiplied with a weighting coefficient $\alpha$ at the gain control circuit 76, and then supplied to the adder 77. Accordingly, the analog conversion level of the output signal of the adder 77 becomes the sum of the output analog conversion level of the absolute-value circuit 72 at the time t2 and the analog conversion level of the above differential signal $\alpha d$. Therefore, the sum of the analog conversion levels becomes of the form shown by the dotted line arrow I at the time t3, as shown in FIG. 10. The above expected signal shown by the dotted line arrow I, is obtained at the time t2 as a signal which expects output analog conversion level of the absolute-value circuit 72 at the time t3. Moreover, the solid line arrow II shows the actual output analog conversion level of the absolute-value circuit 72 at the time t3 which is one sampling period after the time t2, and this level thus obtained is approximately equal to the expected signal.

In the system according to the present invention, the input signal level of the A/D converter 13 is controlled, and transmitted according to the above described expected signal, and by performing an opposite level-control as that performed on the transmitting end at the receiving end, transmission of a digital modulated wave having a certain number of bits, is performed without requiring bits which are used for the control signals.

The expected signal obtained from the adder 77, is supplied to comparators 78 and 79 respectively, wherein the level of the signal thus supplied to these comparators, are respectively compared with an output signal level of an upper limit level setting circuit 80 and a lower limit level setting circuit 81. When the level range which is the difference between the set upper limit level of the upper limit level setting circuit 80 and the set lower limit level of the lower limit level setting circuit 81, shows a certain level range which can be transmitted by the A/D converter 13 having few number of bits, and the expected signal level becomes larger than the set upper limit level, the whole level range is shifted upwards. On the other hand, when the expected signal level becomes smaller than the set lower limit level, the whole level range is shifted downwards.

Figure 11:
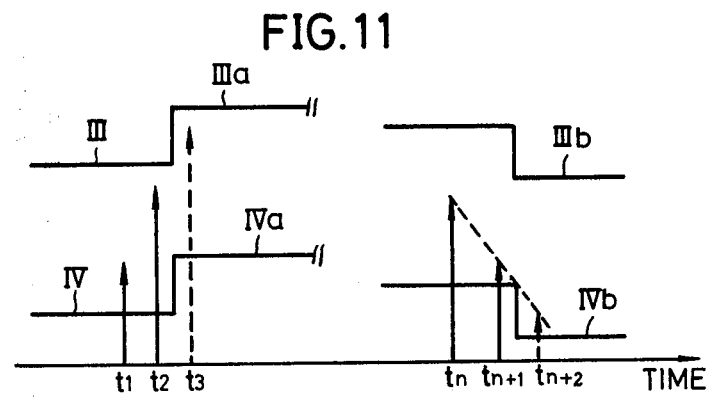
FIG. 11 is a graph for explaining the operation of the other essential parts of the systematic block diagram of FIG. 9.

In a state where the set upper limit level and the set lower limit level can respectively be shown by the lines III and IV of FIG. 11, for example, and when the expected value of the output analog conversion level of the absolute-value circuit 72 obtained at the time t2, which is shown by the dotted line arrow at time t3 exceeds the set upper limit level III, a signal which increases the value of the set upper limit level of the upper limit level setting circuit 80 so as to be larger than the expected value as shown by the line IIIa, is supplied from the comparator 78. Furthermore, the set lower limit level of the lower limit level setting circuit 81 is increased by the same amount, as shown by the line IVa. Moreover, the comparator 78 supplies an output control signal in order to reduce the gain of the gain control circuit 71, and attenuates the signal level of the signal which is supplied from the gain control circuit 71 to the A/D converter 13 at the time t3, into a predetermined level.

On the other hand, when the expected signal level of the time $t_{n+2}$ which is obtained at the time $t_{n+1}$, becomes lower than the set lower limit level up to that time, as shown in FIG. 11, a signal which reduces the set lower limit level of the lower limit level setting circuit 81 so that the level is lower than the expected signal level at the time $t_{n+2}$ as shown by the line IVb, is supplied from the comparator 79. Furthermore, the set upper limit level of the upper limit level setting circuit 80 is reduced by the same amount as shown by the line IIIb, by a control signal. Moreover, the comparator 79 supplies an output control signal in order to increase the gain of the gain control circuit 71, and intensifies the signal level of the signal which is supplied from the gain control circuit 71 to the A/D converter 13 at the time $t_{n+2}$, into a predetermined level.

Accordingly, the analog conversion level of the signal (sampled signal) which is supplied from the gain control circuit 71 and supplied to the A/D converter 13, is adjusted so as to be in the level range in which the signal can be transmitted by the A/D converter 13 maintaining high quality, and also controlled along the range where the level variation is constantly large. Hence, when the level variation of the input signal is large, the minimum level of quantization is increased, and in the other case where the level variation of the input signal is small, the minimum level of quantization is reduced, and thus, more fine quantization can be performed.

Figures 12, 13:
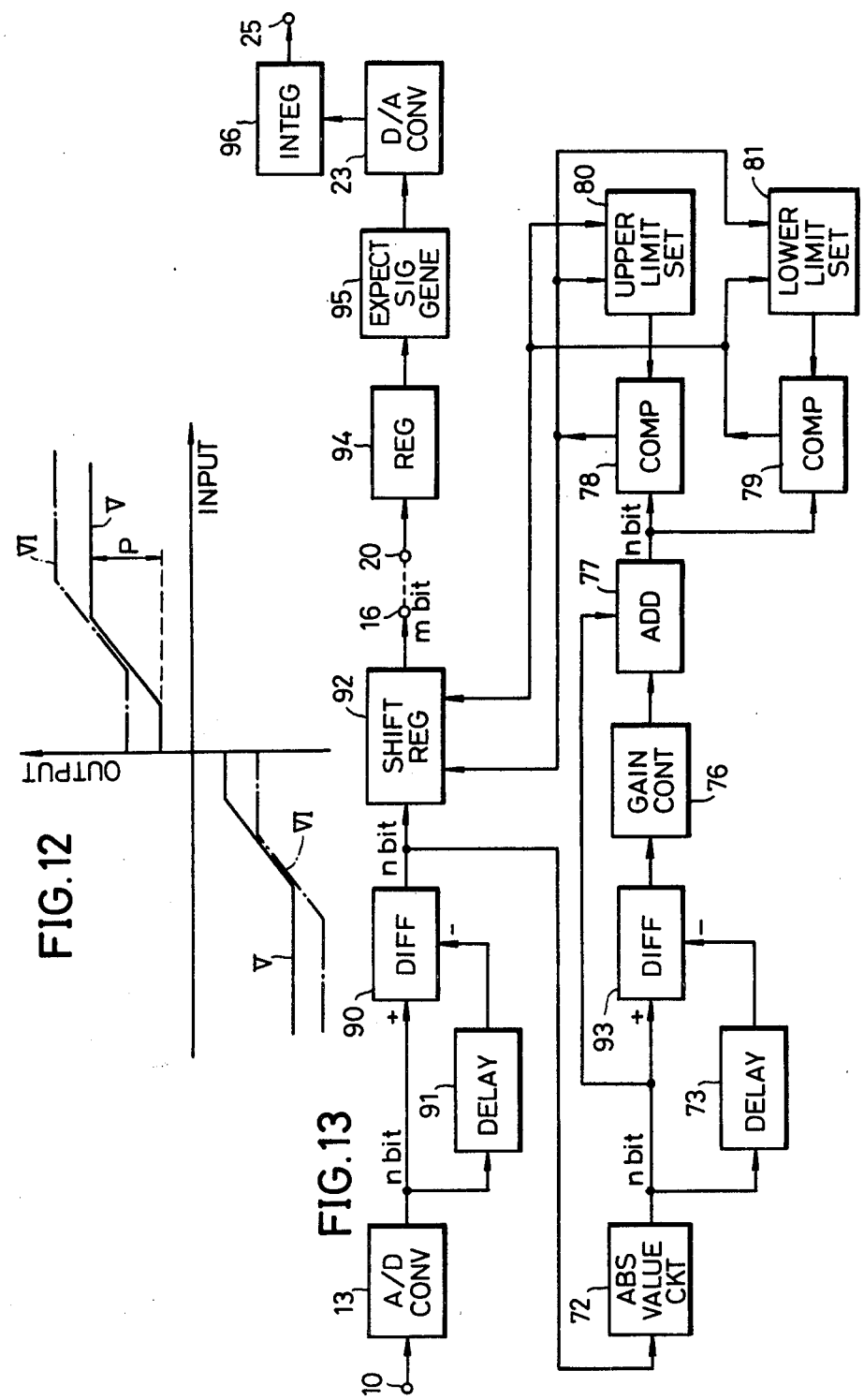
FIG. 12 is a graph showing the input/output characteristic of a gain control circuit within the compression system of the systematic block diagram of FIG. 9.
FIG. 13 is a systematic block diagram showing a fourth embodiment of the digital modulated signal compressing and expanding system according to the present invention.

FIG. 12 shows the analog converted input/output characteristic of the gain control circuit 71, and the solid line V and the one-dot chain line VI respectively show the input/output characteristic at a certain time and the input/output characteristic at another time, where the dynamic range P is constant.

The output signal of the gain control circuit 71 thus obtained, is converted into a digital modulated signal (such as a PCM signal) by the A/D converter 13. The above digital modulated signal is transmitted through the terminal 16 and the transmission path, and then supplied to the D/A converter 23 at the receiving end through the terminal 20. The signal thus supplied to the D/A converter 23, undergoes digital-to-analog conversion therein, and then respectively supplied to a sampling and holding circuit 82 and a gain control circuit 84. The output signal of the sampling and holding circuit 82, is supplied to an expected signal generating circuit 83.

The circuit construction of the expected signal generating circuit 83 is similar to that of the expected signal generating circuit 70. However, when the expected signal level becomes higher than the set upper limit level, the set upper and lower limit levels are respectively increased by a predetermined quantity, and a control signal which increases the gain of the gain control circuit 84 to a predetermined gain is supplied from the expected signal generating circuit 83. On the other hand, when the signal level is lower than the set lower limit level, the set upper and lower limit levels are respectively reduced, and a control signal which reduces the gain of the gain control circuit 84 into a predetermined gain is supplied from the expected signal generating circuit 83. Therefore, the expected signal generating circuit 83 differ from the expected signal generating circuit 70 in the above described points.

The output signal of the gain control circuit 84 thus obtained, is passed through the low-pass filter 24, and supplied from the output terminal 25 as output after being converted back into the original analog signal.

According to the present embodiment of the invention, since the system is constructed so that control signals for the gain control circuits 71 and 84 are obtained depending on whether the expected signal level obtained from the sampled signal exceeds the set upper or lower limit levels, there is no need to transmit a special gain control signal, and therefore, the digital modulated signal can be transmitted by use of fewer number of bits as compared to the conventional system. Furthermore, when the input analog signal level is low, the minimum level of quantization is reduced, and hence a more fine quantization can be obtained, and the quantization noise is reduced.

Moreover, in the above described embodiment of the invention, the expected signal is obtained from the adjacent sampled signal, however, the expected signal can also be obtained by use of an average value of the respective sampled signal of one and two sampling periods before the present time, and the sampled signal at the present time.

A fourth embodiment of the present invention will now be described in conjunction with FIG. 13. In FIG. 13, those parts which are the same as those corresponding parts in FIG. 9 are designated by the like reference numerals, and their description will be omitted. The output signal of the A/D converter 11 is supplied to a difference circuit 90 on one hand, and also supplied to a delay circuit 91 on the other wherein the signal thus supplied is delayed by one sampling period of the above sampling and then supplied to the difference circuit 90. The difference circuit 90 subtracts the output digital signal of the delay circuit 91, from the output digital signal of the A/D converter 11, and supplies an output difference signal between these two signals. Accordingly, the input digital signal of the difference circuit 90, is a DPCM signal in which a signal which corresponds to the amplitude difference between the sampling interval between the adjacent signals, and this output difference signal is thus supplied to a shift register 92.

The above described difference signal is a digital signal, and when this signal comprises eight bits, for example, the output digital signal which is supplied from the absolute-value circuit 72 after the abslute value has been detected therein also comprises eight bits. When the above signal is supplied to a difference circuit 93, and also supplied to the delay circuit 73. The signal thus supplied to the delay circuit 73 is delayed by a time equal to the sampling period upon sampling performed in the A/D converter 11, and then supplied to the difference circuit 93.

The difference circuit 93 is an operational circuit which obtains the difference between the output n-bit digital signal of the absolute-value circuit 72, and the output n-bit digital signal of the delay circuit 73 of one samples before the present time. The output n-bit difference circuit 93 is supplied to the gain control circuit 76. Since the construction and operation of the above described parts and the gain control circuit 76 are the same as those of the embodiment shown in FIG. 9, their description will be omitted. The comparator 78 supplies a shift pulse for shifting the data in the shift register 92 towards the left-hand-side direction only when the output expected signal level of the adder 77 is larger than the output upper limit level of the upper limit level setting circuit 80, to shift the data by one bit, for example. Furthermore, the comparator 78 increases the setting levels of the upper limit level setting circuit 80 and the lower limit level setting circuit 81, by a constant level. The above described operation is repeated until the expected signal level becomes lower than the output upper limit level of the upper limit level setting circuit 80, and constructed so that the operation is completed within the time before the arrival of the next incoming expected signal (within one sampling period).

Similarly, the comparator 79 supplies a shift pulse for shifting the data in the shift register 92 towards the right-hand-side direction only when the output expected signal level of the adder 77 is lower than the output lower limit level of the lower limit level setting circuit 81, to shift the data by one bit, for example. Furthermore, the comparator 79 reduces the setting levels of the upper limit level setting circuit 80 and the lower limit level setting circuit 81, by a constant level. The above described operation is repeated until the expected signal level becomes higher than the output lower limit level of the lower limit level setting circuit 81, and constructed so that the shift register 92 is a circuit which supplies an m-bit (m<n) digital signal as a DPCM signal, and is capable of showing a high level signal by use of m bits by the shift to the left-hand-side direction, and a low level signal by use of m bits by the right direction of the shift register.

FIG. 14 is a graph for describing the operations of the upper limit level setting circuit 80, and the lower limit level setting circuit 81. In FIG. 14, the solid line arrow shows the analog conversion level of the output n-bit difference signal of the absolute-value circuit 72, the dotted lines show the analog conversion level of the expected signal obtained at that time, the one-dot chain line I show the upper limit level set by the upper limit level setting circuit 80, and the one-dot chain line II shows the lower limit level set by the lower limit level setting circuit 81. As seen in FIG. 14, when the expected signal level of time t3 obtained at time t2 exceeds the upper limit level I, the upper limit level I and the lower limit level II are respectively increased by the same level so that the upper limit level I becomes higher than the expected signal level at time t6 becomes lower than the lower limit level II are respectively reduced. Moreover, at a time t10, when the expected signal level of time t11 exceeds the upper limit level I, the upper limit level I and the lower limit level II are respectively increased by the same level so that the upper limit level I is higher than the expected signal level at the next time t11.

The DPCM signal thus obtained, is applied to a register 94 through the terminal 16, a certain transmission path, and through the terminal 20. The above signal which is latched therein, and then applied to an expected signal generating circuit 95. The expected signal generating circuit 95 in the expanding system is of the same construction as the expected signal generating circuit in the compressing system. However, when the analog conversion level of the expected signal is higher than the set upper limit level, the set upper limit level is increased so that the set upper limit level becomes larger than the absolute value of the difference between the analog conversion level of the expected signal and the upper limit level. On the other hand, when the analog conversion level of the expected signal is lower than the set lower limit level, the set lower limit level is reduced so that the absolute value of the difference between the analog conversion level of the expected signal and the lower limit level. Furthermore, the expected signal generating circuit supplies a shift pulse for shifting the contents of the register in the opposite direction as the compressing system. Accordingly, the output n-bit digital signal of the expected signal generating circuit 95 becomes equal to the input n-bit digital signal of the shift register 92. The above digital signal undergoes conversion at the D/A converter in the next stage, and supplied from the output terminal 25 after being demodulated into an original analog signal through an integrator 96 and a low-pass filter (not shown).

Hence, according to the present embodiment of the invention, the differential signal of the input analog signal is bit-shifted according to the expected signal, and thus, even when the input analog signal is a signal having sudden level variation, the level variation in the differential signal is not much effected. Moreover, the bit-shift in the differential signal can be performed at the maximum for the n-bits of the difference signal. As opposed to the conventional system in which only m-bits of the transmission bits could be quantized, the present invention provides a system for quantizing n stages of bits (n>m). Therefore, the input analog signal can be accurately transmitted by the DPCM signal. Furthermore, when the level variation in the analog signal is large, the upper bits of the input difference signal is transmitted by the shift register 92. Accordingly, the slope overload noise can be greatly reduced as compared to the conventional system. When the variation in the analog signal is small, the lower bits of the input difference signal is transmitted by the shift register 92, and hence, the granular noise can be greatly reduced as compared to the conventional system.

Furthermore, the granular noise can be more effectively reduced by increasing the number of lower signal bits in the difference circuit 90.

In the above embodiment of the invention, the difference circuits 90 and 93 obtain the difference between the digital signal at the present time and the digital signal of one sample before the present time. However, the method of obtaining the difference is not limited to the above method, and can be obtained from an average value $$\left( \frac{d_n + d_{n-1}}{2} \right)$$

where $d_n$ is the difference between the digital signal at the present time and the digital signal of one sample before the present time, and $d_{n-1}$ is the difference between the digital signals of one and two samples before the present time.

Moreover, a RAM (Random Access Memory) capable of storing a plurality of sampled signals can be used instead of the absolute-value circuit 72, and furthermore providing a second adder on the output side of the adder 77, and a shift register which momentarily stores the output of the second adder and feeds back the output to the second adder, so that the output expected signal of the second adder is supplied to the comparators 78 and 79. In this case, when the output signal of the second adder, the output digital signal of the above RAM at the present time, and the output digital signal of the above RAM of k samples before the present time, are respectively designated by $\hat{x}$, $x_l$, and $x_{l-k}$, the system can be constructed so that an expected signal $\hat{x}$ which can be expressed by the following equation (8) is supplied as output.

$$\hat{x} = \frac{1}{2j} \left( \sum_{k=0}^{2j-1} (|x_{l-k}| + (k+1)(|x_{l-k}| - |x_{l-k+1}|)) \right) \quad (8)$$

Next, a fifth embodiment of the present invention will be described in conjunction with FIG. 15. In FIG. 15, those parts which are the same as those corresponding parts in FIG. 9 are designated by the like reference numerals, and their description will be omitted. The incoming analog signal which is applied to the input terminal 10, is eliminated of its unnecessary high-frequency components at the low-pass filter 11. The signal thus eliminated of its high-frequency components, is respectively supplied to a voltage comparator 100 and a delay circuit 101. The delay circuit 101 is a circuit which delays the input analog signal by one sampling interval (or a time corresponding to one sampling interval times an integer) of the sampling and holding circuit 12. The output signal of the delay circuit 101 is reversed of its signal polarity at an inverting amplifier 102, and then supplied to the voltage comparator 100, wherein the input analog signal of the low-pass filter 11 and the signal thus supplied to the voltage comparator 100 is compared. Accordingly, the output analog signal of the voltage comparator 100 is an analog differential signal obtained by subtracting the analog signal of one sampling interval after the present time from the analog signal of the present time. The above analog differential signal is sampled at the sampling and holding circuit 12, and supplied to the variable gain amplifier 71 and the absolute-value circuit 72 within the expected signal generating circuit 70 which is shown by the dotted lines. Other parts constructing the system of the present embodiment is the same as those of the third embodiment shown in FIG. 9, and hence their description will be omitted.

A sixth embodiment of the present invention will now be described in conjunction with FIG. 16. In FIG. 16, those parts which are the same as those corresponding parts in FIG. 13 are designated by the like reference numerals.

Two values of n-bit digital signal (such as the PCM signal) which is obtained by sampling the input analog signal at the A/D converter 11 and quantizing the signal thus sampled, is supplied to the shift register 92. The shift register 92, as will be described in the following, performs a shifting operation in a predetermined direction by the output signal supplied from a comparator 110. Moreover, the shift register 92 performs bit-compression on the input n-bit digital signal into an m-bit digital signal, and transmits the signal thus obtained to the receiver system through the terminal 16, and furthermore, supplies the above signal thus obtained to the absolute-value circuit 72 within the expected signal generating circuit (where in the above explanation, m<n).

The m-bit digital signal which is obtained by having detected the absolute value of the signal at the absolute-value circuit 72, is supplied to the difference circuit 93, and a delay circuit 112 wherein the signal thus supplied to the delay circuit 112 is delayed by a time equal to the sampling period of the sampling performed in the A/D converter 11, and the signal thus delayed is then supplied to the difference circuit 93.

The difference circuit 93 is an operational circuit which obtains the difference between the output m-bit digital signal of the absolute-value circuit 72 and the output m-bit digital signal of one sample before the present time of the delay circuit 112. The output m-bit differential signal of the above difference circuit 93, is supplied to the gain control circuit 76. The gain control circuit 76 is used for adding a suitable weighting coefficient so that the distortion component in the final demodulated output signal is minimum, and can be constructed from a multiplier and a coefficient circuit.

The output m-bit differential signal of the gain control circuit 76 is added with the output m-bit differential signal of the absolute-value circuit 72 at the adder 77, and the signal thus obtained as a result of the adding is used as an expected signal of the m-bit digital signal.

The analog conversion value $P_n$ of the output digital signal of the difference circuit 93 can be described by the following equation (9).

$$P_n = |d_n| - |d_{n-1}| \qquad (9)$$

Accordingly, the above analog conversion value $P_n$ becomes the minor coefficient of the differential signal. Hence, the analog conversion value $P'_{n+1}$ of the expected signal becomes:

$$P'_{n+1} = |d_n| + \alpha \dot{P}_n \qquad (10)$$

Where, in the above equation (10), $\alpha$ designates the weighting coefficient which is added by the gain control circuit 76.

The expected signal thus obtained as described above, is applied to the comparator 110, wherein comparison between the reference level of a reference level setting circuit 111 at the present time and the analog conversion level is performed. Therefore, when the analog conversion level of the expected signal is higher than the reference level, the comparator 110 applies a logic "1" signal to the shift register 92 which is used as a bit selection circuit, to shift the contents of the shift register 92 in the MSB direction (left direction). On the other hand, when the analog conversion level of the expected signal is lower than the reference level, the comparator 110 applies a logic "−1" signal to the shift register 92, to shift the contents of the shift register in the LSB direction (right direction).

Besides making the shift register 92 perform the above described shifting operation, when the output logic of the comparator 110 is "1", the comparator 110 changes the output of the reference level setting circuit 111 into a reference level which is 6 to 12 dB higher than the reference level at the present time, and, makes the delay circuit 112 perform the same shifting operation as that performed by the shift register 92. On the other hand, when the output of the comparator 110 is of logic "−1", the comparator 110 changes the reference level of the reference level setting circuit 111 into a reference level which is 6 to 12 dB lower than the reference level at the present time, and, makes the delay circuit 112 perform the same shifting operation as that performed by the above shift register 92. The delay circuit 111 is made to perform the same shifting operation as that performed by the shift register 92, so that a correct differential signal can be obtained from the difference circuit 93.

The above shifting operation performed by the shift register 92 and the delay circuit 112, and the varying of the reference level of the reference level setting circuit 111 performed due to the output of the comparator 110, are performed within one sampling period T. The input n-bit digital signal at a certain time which is expected by the above expected signal, is selected of its m bits according to the expected signal and then transmitted. In cases other than those described above (after the variation of the above reference level, for example), the comparator 110 supplies a "0" as its output signal, and does not operate any other circuits.

When the signal which is to be transmitted is a DPCM signal, the shift register 92 is constructed as shown by a numeral 92a shown by the dotted lines of FIG. 17. A difference circuit 121 obtains the difference between the n-bit digital signal which is supplied from the A/D converter 11 through a terminal 120 and the n-bit digital signal which is delayed by one sample at a delay circuit 122. A shift register 123 selects m bits from the output signal of the difference circuit 121, and then performs the transmission. The output of the shift register 123 is obtained through a terminal 126, and also supplied to a shift register 124 wherein the signal supplied thereto is shifted. The output of the shift register 124 and the output of the delay circuit 122 are added at an adder 125, and the output of this adder 125 is then supplied to the delay circuit 20 which delays the incoming signal by one sample. The output of the comparator 110 is respectively supplied to the shift registers 123 and 124 through a terminal 127.

Furthermore, in order to transmit a digital signal other than the DPCM signal, the shift register 92 can be constructed as shown by a numeral 92b which is shown by the dotted lines of FIG. 18. In FIG. 18, the shift register 92b comprises an adder 128 which adds the input n-bit digital signal and the output of the delay circuit 122, shift registers having similar functions as those of the shift registers 123 and 124 of FIG. 17, a difference circuit 129 which obtains the difference between the output of the adder 128 and the output of the shift register 124, and the delay circuit 122 which delays the output of the difference circuit 129 by one sample and supplies the signal thus delayed to the adder 128.

A seventh embodiment of the present invention will now be described in conjunction with FIG. 19. In FIG. 19, those parts which are the same as those corresponding parts in FIGS. 9 and 16 are designated by the like reference numerals, and their description will be omitted. When the analog conversion level of the expected signal is higher than the reference level set by the reference level setting circuit 121, the comparator 78 supplies an output pulse which shifts the contents of the shift register 92 and the delay circuit 120 in a predetermined direction. On the other hand, when the analog conversion level of the expected signal is lower than the reference level of the shift register 122 which is obtained by shifting the output of the reference level setting circuit 121 by one or two bits (the reference level of the shift register 122 is therefore lower than the output reference level of the reference level setting circuit 121 by 6 to 12 dB), the comparator 79 supplies an output pulse which shifts the contents of the shift register 92 and the delay circuit 120 in a predetermined direction. Hence, the reference level setting range in which the shift register 92 and the delay circuit 120 do not perform the shifting operation, is 6 to 12 dB, and is a very samll range.

Accordingly, the expected signal which is obtained from the adder 77, is respectively supplied to the comparators 78 and 79, wherein comparison is respectively performed with the signals supplied therein and the set output reference levels of the reference level setting circuit 121 and the shift register 122. The comparator 78 supplies an output shifting pulse which shifts the data of the shift register 92 in the left direction, by one bit, for example, only when the analog conversion level of the output expected signal supplied by the adder 77 is higher than the output reference level (upper limit level) of the reference level setting circuit 121, and increases the set upper limit reference level of the reference level setting circuit 121 to a certain level. Therefore, the output reference level of the shift register 122 is also increased by the above certain level. The above operations described, is repeatedly performed until the analog conversion level of the expected signal becomes lower than the output upper limit reference level of the reference level setting circuit 121, and the system is constructed so that the above operation is completed within the arrival time of the next incoming expected signal (one sampling period).

Similarly, the comparator 79 supplies an output shifting pulse which shifts the data of the shift register 92 in the right direction, by one bit, for example, only when the analog conversion level of the above expected signal is lower than the set reference level (lower limit level) of the shift register 122, and reduces the set reference level of the reference level setting circuit 121 to a certain level. Accordingly, the output reference level of the shift register 122 is also reduced by the above certain level. The above described operation is repeatedly performed until the analog conversion level of the expected signal becomes higher than the output lower limit reference level of the shift register 122, and thus the shifting pulses are also repeatedly supplied as output until the above condition is met. The shift register 92 is a circuit which supplies an output digital signal having m bits (m<n), capable of describing a high-level signal in m bits by use of the shifting pulse for the left direction shift, and also capable of describing a low-level signal in m bits by use of the shifting pulse for the right direction shift.

Further, this invention is not limited to these embodiments but various variations and modifications may be made without departing from the scope of the invention.

What is claimed is:

1. A digital compandor capable of selectively increasing and decreasing the dynamic range of a digital input signal thereof comprising:

variable gain circuit means and control signal generating circuit means operatively connected to said variable gain circuit means for generating a control signal to change the gain of said variable gain circuit means, said variable gain circuit means delivering an m bit digital output signal (m being an integer) in response to an n bit digital input signal (n being an integer, where m<n) and said control signal when said compandor is operating as a compressor to decrease the dynamic range, and delivering an n bit digital output signal in response to an m bit digital input signal and said control signal when said compandor is operating as an expander to increase the dynamic range, said control signal generating circuit means comprising:
first means producing, in response to the output signal of said variable gain circuit, an expected signal Zn which satisfies the equation $$Zn = \sum_{i=0}^{N} a_i \cdot | y_{n-i} |$$

where $a_i$ is a weighting coefficient which is in the range between zero and an arbitrary natural number N, and yn is said digital input signal;
second means for producing a reference signal;
a comparator for comparing said reference signal and said expected signal; and
third means for producing said control signal in response to the output signal from said comparator, said third means further changing an equivalent analog value of said reference signal in response to an output signal level of said comparator.

2. A digital compandor as claimed in claim 1 in which said variable gain circuit means comprises:
delay circuit means for producing a delayed output signal;
a difference circuit for obtaining the difference between the n bit digital input signal applied thereto and the output signal from said delay circuit means;
a first shift register for changing the n bit digital signal from said difference circuit into an m bit digital output signal thereof in a bit shifting manner in response to the control signal from said control signal generating circuit means;
a second shift register for changing said m bit digital output signal from the first shift register back into an n bit signal by bit shifting in reverse manner of the operation of the first shift register, said second shift register further passing said m-bit digital signal; and
an adder for adding said n-bit signal from the second shift register and said output signal from said delay circuit means, said delay circuit means delaying the output from said adder.

3. A digital compandor as claimed in claim 1 in which said variable gain circuit means comprises:
delay circuit means for producing a delayed output signal;

an adder for adding n bit digital input signal thereto to the output signal from said delay circuit means;

a first shift register for changing the n bit digital output signal from said adder into an m bit digital output signal thereof in a bit shifting manner in response to the control signal from said control signal generating circuit means;

a second shift register for changing said m bit digital output signal from the first shift register back into an n bit signal by bit shifting in reverse manner with respect to the operation of the first shift register, said second shift register further passing said m-bit digital signal; and a difference circuit for obtaining the difference between said n-bit signal from the second shift register and the n bit digital output signal from said adder, said delay circuit means delaying the output signal from said difference circuit.

4. A digital compandor as claimed in claim 1 in which said variable gain circuit means comprises:

a delay circuit for delaying said digital input signal of said compandor for one sampling period;

a difference circuit for obtaining the difference between said digital input signal and the delayed output signal from said delay circuit; and a shift register for receiving the output signal from said difference circuit.

5. A digital compandor as claimed in claim 1 in which said first means comprises:

an absolute value circuit for detecting the absolute value of the digital signal being fed to or from said variable gain circuit means;

a delay circuit for delaying the output signal from said absolute value circuit; a difference circuit for obtaining the difference between said output signal from said absolute value circuit and the output signal from said delay circuit; and an adder for adding the output signal from said difference circuit and said output signal from said absolute value circuit.

6. A digital compandor as claimed in claim 1 in which said first means comprises:

an absolute value circuit for producing the absolute value of the digital signal delivered from said variable gain circuit means;

a delay circuit for delaying the output signal from said absolute value circuit for at least one sampling period;

a difference circuit for obtaining the difference between the output signal from said absolute value circuit and the output signal from said delay circuit; and an adder for adding said output signal from said absolute value circuit and the output signal from said difference circuit to produce said expected signal, said variable gain circuit means further comprising a shift register controlled by said control signal such that when an equivalent analog value of said expected signal exceeds a predetermined level of said second means, the shift register is shifted to the left, and when said equivalent analog value of said expected signal is below the predetermined level, the shift register is shifted to the right, and said control signal simultaneously resets said predetermined level so that said equivalent analog value of said expected incoming signal subsequently falls within a range between the upper reset predetermined level and the lower reset predetermined level.

7. A digital compandor as claimed in claim 1 in which said first means comprises:

an absolute value circuit for producing the absolute value of the digital signal delivered from said variable gain circuit;

a delay circuit for delaying said output signal from said absolute value circuit for at least one sampling period;

a difference circuit for obtaining the difference between the output signal from said absolute value circuit and the output signal from said delay circuit; and an adder for adding said output signal from said absolute value circuit and the output signal from said difference circuit to produce said expected signal, said variable gain circuit means further comprising a shift register, said control signal controlling said shift register such that when an equivalent analog value of said expected signal exceeds a predetermined upper level of said second means, the shift register is shifted to the left, and when the equivalent analog value of said expected signal is below a predetermined lower level of said second means, the shift register is shifted to the right, and said control signal further resets said predetermined upper and lower levels to expand the range between the two levels so that said equivalent analog value of said expected incoming signal subsequently falls within the expanded range.

* * * * *